(12) United States Patent
Grossmann et al.

(10) Patent No.: US 11,867,651 B2
(45) Date of Patent: Jan. 9, 2024

(54) LIGHT EMITTING MODULE INCLUDING ENHANCED SAFETY FEATURES

(71) Applicant: ams Sensors Asia Pte. Ltd., Singapore (SG)

(72) Inventors: Sylvain Grossmann, Eindhoven (NL); Edgar Flores, Zurich (CH)

(73) Assignee: ams Sensors Asia Pte. Ltd., Singapore (SG)

( * ) Notice: Subject to any disclaimer, the term of this patent is extended or adjusted under 35 U.S.C. 154(b) by 66 days.

(21) Appl. No.: 17/621,571

(22) PCT Filed: Jul. 17, 2020

(86) PCT No.: PCT/SG2020/050417
§ 371 (c)(1),
(2) Date: Dec. 21, 2021

(87) PCT Pub. No.: WO2021/010903
PCT Pub. Date: Jan. 21, 2021

(65) Prior Publication Data
US 2022/0357295 A1 Nov. 10, 2022

Related U.S. Application Data

(60) Provisional application No. 62/875,072, filed on Jul. 17, 2019.

(51) Int. Cl.
*G01N 27/22* (2006.01)
*G01N 27/20* (2006.01)

(52) U.S. Cl.
CPC ........... *G01N 27/223* (2013.01); *G01N 27/20* (2013.01)

(58) Field of Classification Search
CPC .............................. G01N 27/223; G01N 27/20
See application file for complete search history.

(56) References Cited

U.S. PATENT DOCUMENTS

2016/0290856 A1  10/2016  Fiederling et al.
2018/0055697 A1  3/2018  Mihali et al.
(Continued)

FOREIGN PATENT DOCUMENTS

CN  107438756 A  12/2017
CN  108196418 A  * 6/2018  ............ G01M 11/00
(Continued)

OTHER PUBLICATIONS

International Search Report for corresponding International Application No. PCT/SG2020/050417, dated Dec. 4, 2020.
(Continued)

*Primary Examiner* — Feba Pothen
(74) *Attorney, Agent, or Firm* — Michael Best & Friedrich LLP

(57) ABSTRACT

Packaged light emitter module can provide improved safety features to facilitate sensing the presence of moisture or a mechanical defect such as a crack in a transmissive cover (22) that may result in a safety hazard caused by the emitted light (24) if the defect or other situation is not addressed in a timely manner. Different electrically conductive structures, such as different electrically conductive traces (20, 22), allow monitoring and detection of mechanical defects to be decoupled from monitoring and detection of problems arising from the presence of moisture. The decoupling can allow the respective configuration for each of the electrically conductive structures to be optimized for detection of particular situations that may lead to a safety hazard.

18 Claims, 3 Drawing Sheets

(56) References Cited

U.S. PATENT DOCUMENTS

2019/0120456 A1* 4/2019 Noda .................. F21S 41/28
2020/0133018 A1 4/2020 Wu et al.

FOREIGN PATENT DOCUMENTS

| CN | 108828562 | A | 11/2018 |
| CN | 208224153 | U | 12/2018 |
| CN | 109154428 | A | 1/2019 |
| CN | 109406577 | A | 3/2019 |
| EP | 3474392 | A1 | 4/2019 |
| TW | 201841445 | A | 11/2018 |

OTHER PUBLICATIONS

Chinese Patent Office Action for Application No. 202080051691.1 dated Jul. 11, 2023 (21 pages).

* cited by examiner

LIGHT EMITTING MODULE INCLUDING ENHANCED SAFETY FEATURES

FIELD OF THE DISCLOSURE

This disclosure relates to light emitting modules that include enhanced safety features.

BACKGROUND

New features are being added to smart phones, tablets and other portable computing devices that include technologies to record three dimensional images, sense motion and/or gestures. Digital recording methods use various types of miniature illuminators, which interact with cameras to record dynamical events in three dimensional regions. These illuminators can be of various forms and deliver different types of functions. Some illuminate a wide area with very short pulses for Light Detection and Ranging (LIDAR) type measurements recording time of flight information. Other illuminators are pulsed or continuous wave (CW), and project structured light patterns onto a scene. The digital camera records an image of the structured light pattern, and software algorithms are used to determine three-dimensional scene information from modifications in the patterned image.

One technology that is suitable for miniature illuminators is high power vertical cavity surface emitting laser (VCSEL) devices and array devices. These devices can be pulsed with very fast rise times suitable for time-of-flight applications. They are small, but produce high power laser beams with efficient electro-optic conversion. However, various optical components (e.g., an optical diffuser) can be placed in the beam path to modify the beam properties for the specific application.

The optical output power of a bare VCSEL typically can, in some cases, be so high that it may cause damage to a person's eye or skin in the event the quality of the optical component is compromised. Thus, it is important to ensure that the high power laser illuminators meet laser safety regulations when operated in the portable computing devices. For example, the illuminator may be part of an assembly that, under normal operating conditions, maintains eye-safe operation by preventing a person from getting too close to the illuminator. However, in some cases, damage (e.g., cracks) to the optical structure that modifies the output beam for safe operation, or the presence of moisture or chemical contamination on the optical structure, may result in safety hazards. Likewise, if the optical structure were to fall off or be removed, safety could be compromised.

SUMMARY

The present disclosure describes packaged illumination and other light emitter modules that, in some instances, have improved safety features and facilitate sensing the presence of moisture or a crack in a transmissive cover over the VCSEL or other light source.

For example, in one aspect, the disclosure describes an apparatus that includes a light emitter operable to produce light having a particular wavelength. A transmissive cover is disposed so as to intersect a path of light emitted by the light emitter, wherein the transmissive cover is substantially transparent to the wavelength of light produced by the light emitter. First and second electrically conductive structures (e.g., electrically conductive traces) are provided.

In some instances, a first electrically conductive structure is disposed on a first surface of the transmissive cover, and a second electrically conductive structure is disposed on a second surface of the transmissive cover, wherein the second surface is different from the first surface, and each of the first and second surfaces intersects a path of the light produced by the light emitter. In other instances, a first electrically conductive structure is disposed on a surface of the transmissive cover, wherein the surface intersects a path of the light produced by the light emitter, and a second electrically conductive structure is disposed on the same side of the transmissive cover as the first electrically conductive structure and is separated from the first electrically conductive structure by an insulating layer.

The apparatus further includes a controller. Each of the first and second electrically conductive structures is coupled electrically to the controller. The controller is operable to monitor a respective electrical characteristic of each of the first and second electrically conductive structures such that if the monitored characteristic for a particular one of the first or second electrically conductive structures changes by more than a respective predetermined amount, the controller regulates an optical output produced by the light source. In some instances, the controller resides in the package itself, whereas in other instances, it resides in a host device (e.g., smartphone) in which the package is integrated. If mechanical damage or moisture is sensed, the controller can facilitate fast switching-off of the emitter power before eye or other damage can occur. If the controller is inside the module, the module can independently and immediately switch off the emitter power and need not rely on the phone manufacturer processing circuitry.

Some implementations include one or more of the following features. For example, in some cases, the first electrically conductive structure is arranged for detecting a mechanical defect (e.g., a crack) in the transmissive cover, and the second electrically conductive structure is arranged for detecting the presence of moisture. In some instances, the controller is operable to monitor signals from the first electrically conductive structure for a change in resistance, and is operable to monitor signals from the second electrically conductive structure for a change in capacitance. In some implementations, the controller is operable to monitor the respective electrical characteristic of each of the first and second electrically conductive structures such that if the monitored characteristic for a particular one of the first or second electrically conductive structures changes by more than a respective predetermined amount, the controller causes the optical output produced by the light source to be stopped.

In some cases, at least one of the first or second electrically conductive structures is composed of a material (e.g., indium tin oxide (ITO)) that is substantially transparent to the wavelength of light produced by the light emitter. Such electrically conductive structures can at least partially overlap a footprint of an optical beam emitted by the light source. In some instances, at least one of the first or second electrically conductive structures is composed of a material (e.g., chrome) that is substantially opaque to the wavelength of light produced by the light emitter. In such case, the electrically conductive structure preferably does not overlap a footprint of an optical beam emitted by the light source.

Providing different electrically conductive structures allows monitoring and detection of mechanical defects such as cracks to be decoupled from monitoring and detection of problems arising from the presence of moisture. The decoupling allows the respective configuration for each of the electrically conductive structures (e.g., traces) to be optimized for detection of particular situations (e.g., the presence of cracks in the optical assembly or the presence of moisture in the package). Such decoupling can, in some instances, improve the safety of the package by facilitating the regulation of power provided to the light source when various types of potential hazards are present.

Other aspects, features and advantages will be readily apparent from the following detailed description, the accompanying drawings and the claims.

DETAILED DESCRIPTION

The present disclosure describes illumination modules and techniques to facilitate detection of an abnormality that might cause an eye-safety hazard or other risk. In general, detection of the abnormality can be implemented by providing electrically conductive traces on opposing surfaces, or in some cases on the same surface, of a transmissive cover disposed in the path of the light beam emitted by a VCSEL or other light source. The electrically conducting traces can be configured, for example, such that the presence of moisture (e.g., condensation) on a first one of the traces or a crack in a second one of the traces causes a change in an electrical characteristic (e.g., electrical continuity, capacitance and/or electrical resistivity) that can be detected by processing circuitry. In appropriate circumstances (e.g., if a detected change in the electrical characteristic indicates there may danger to eye or skin safety), the processing circuitry can turn off or otherwise regulate (e.g., reduce) the optical power output of the light emitter.

Figure 1:
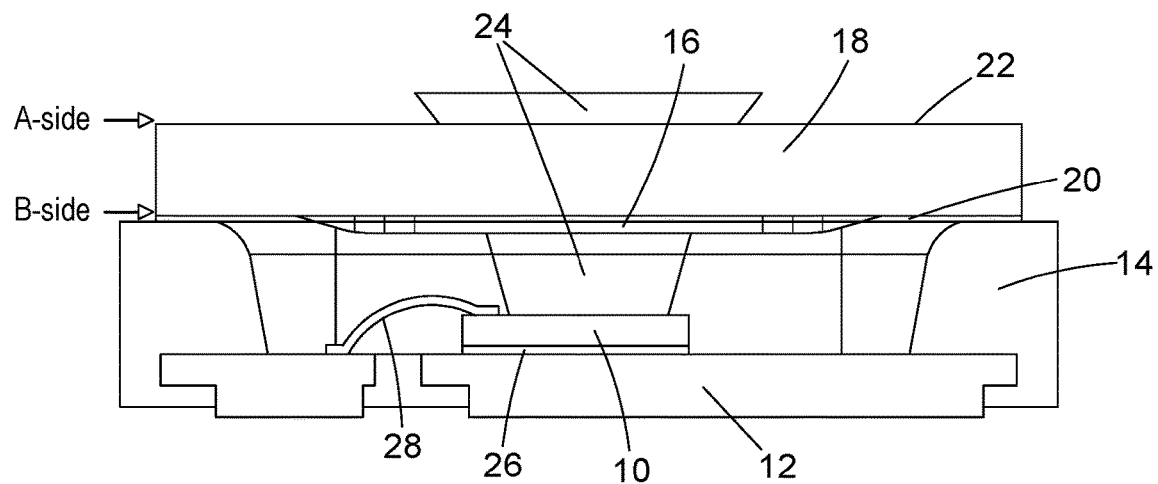
FIG. 1 is a cross-sectional view of an illumination module.

FIG. 1 illustrates an example of a packaged light emitter module in accordance with the present disclosure. A molded package housing 14 has a cavity in which a light source 10 is mounted. In the following discussion, it is assumed that the light source 10 is a VCSEL chip. In some implementations, the light source 10 is implemented as an array of VCSELs. Further, in some instances, the light source 10 is implemented as one or more light emitting diodes (LEDs), infra-red (IR) LEDs, organic LEDs (OLEDs), or infra-red (IR) lasers. In general, the light source 10 is operable to emit light 24 at a particular wavelength or within a relatively narrow wavelength range (e.g., infra-red).

The light source 10 can be mounted, for example, to a copper lead frame 12 or other substrate such as a printed circuit board (PCB). In this example, the light source 10 is directly bonded to a conductive pad 26 using solder or similar electrically conducting bonding material. This provides one electrical contact (e.g., a cathode) as well as providing thermal conducting path. A second electrical contact (e.g., an anode) can be made to the light source 24 using wire bonding 28.

An optical component 16 is disposed over the light source 10 so as to intersect the path of light beam(s) 24 produced by the light source. The optical component 16 can include, for example, a microlens array (MLA), an optical diffuser, a lens, a refractive or diffractive optical element, a diffuser, a spectral filter, a polarizing filter, and/or some other optical structure operable to modify the optical characteristics of the VCSEL output beam(s) 24. As shown in the illustrated example, the optical component 16 can be disposed within a cavity in the molded housing 14 of the package. In other implementations, the optical component 16 may be disposed outside the housing for the package.

As further shown in FIG. 1, the module includes a transmissive cover 18 disposed over the optical component 16. Together, the transmissive cover 18 and optical component 16 form an optical assembly. The cover 18, which can be composed, for example, of glass, is substantially transparent to the light produced by the light source 10. In the example of FIG. 1, a first side of the transmissive cover 18 (e.g., the outward-facing or A-side) has a first electrically conductive structure (e.g., a trace) 22 on its surface arranged to sense a crack in the transmissive cover. The presence of such a crack may pose, for example, an eye-safety hazard. However, a crack in the cover 18 typically will lead to a crack in the trace 22 as well, and by monitoring the resistance of the trace 22, the presence of such a crack can be detected and appropriate action can be taken. The second side of the transmissive cover 18 (e.g., the inward-facing or B-side) has a second electrically conductive structure (e.g., a trace) 20 on its surface arranged to sense moisture on inner-facing surface of the transmissive cover. The presence of water droplets on the optical element 16 can change the optical properties of the optical element and can create an eye-safety hazard (e.g., if the light emitted by the VCSEL chip goes straight through the MLA without refraction by the MLA). By monitoring, for example, the capacitance of the trace 20, the presence of moisture can be detected and appropriate action can be taken.

Providing different traces 20, 22 allows monitoring and detection of mechanical defects such as cracks to be decoupled from monitoring and detection of problems arising from the presence of moisture. The decoupling allows the respective configuration for each of the traces 20, 22 to be optimized for detection of particular situations (e.g., the presence of cracks in the optical assembly or the presence of moisture in the package). Such decoupling can, in some instances, improve the safety of the package by facilitating the regulation of power provided to the light source 10 when various types of potential hazards are present.

Figure 2A:
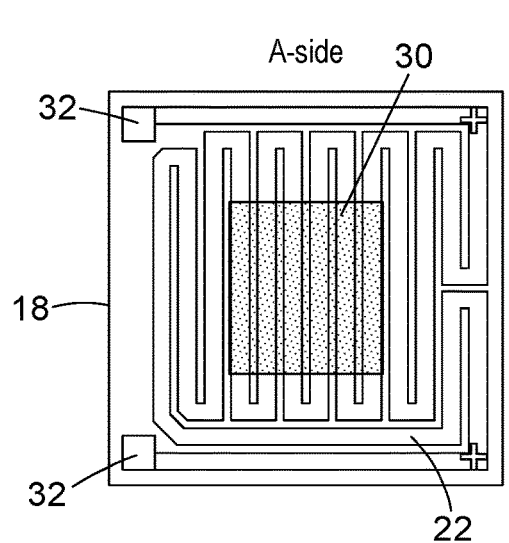
FIG. 2A shows an example of an electrically conductive trace on a transmissive cover for sensing a crack.
Figure 2B:
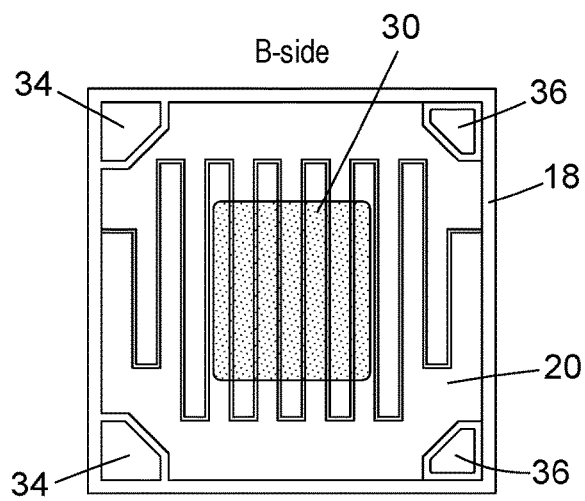
FIG. 2B shows an example of an electrically conductive trace on a transmissive cover for sensing moisture.

FIGS. 2A and 2B show further details of the conductive traces 20, 22 according to some implementations. Preferably, each of the traces 20, 22 is composed of an electrically conductive material that is substantially transparent to the wavelength(s) of light produced by the light source 10. For example, in some implementations, the traces 20, 22 are composed of indium tin oxide (ITO), which is substantially transparent to infra-red light. In other instances, the traces 20, 22 can be composed of another substantially transparent and electrically conductive material. As the traces 20, 22 are transparent to the wavelength(s) of light produced by the light source 10, they at least partially can intersect the footprint 30 of the optical beam(s) emitted by the light source 10 without interfering with the emitted beam(s). The transmissive cover 18 should be sufficiently thick such that there is minimal interference between the two ITO layers. In some implementations, the transmissive cover 18 has a thickness of at least 300 µm, although in some instances, a thickness of as little as 100 µm may be sufficient.

Electrical connection from the trace 22 on the outward facing side (i.e., A-side) of the cover 18 to the inward-facing side (i.e., B-side) can be provided by conductive vias 32 (see FIG. 2A and FIG. 3) that connect to conductive contacts (e.g., pads) 34 on the inward-facing side (i.e., B-side) (see FIG. 2B). The trace 20 on the inward-facing side (i.e., B-side) is connected to conductive contacts (e.g., pads) 36. Thus, in the illustrated example, electrical connections for both traces 20, 22 are on the inward-facing side (i.e., B-side) of the transmissive cover 18. In some cases, an electrically insulating layer (e.g., $SiO_2$) protects the ITO layers 20, 22. Openings in the electrically insulating layer provide access to the various conductive vias and contacts (e.g., 23, 34 and 36). The conductive pads 34, 36 can be connected, respectively, to appropriate voltages (e.g., ground and $V_{CC}$). Depending on the implementation, the two traces 20, 22 may be connected to separate or a common ground.

Figure 3:
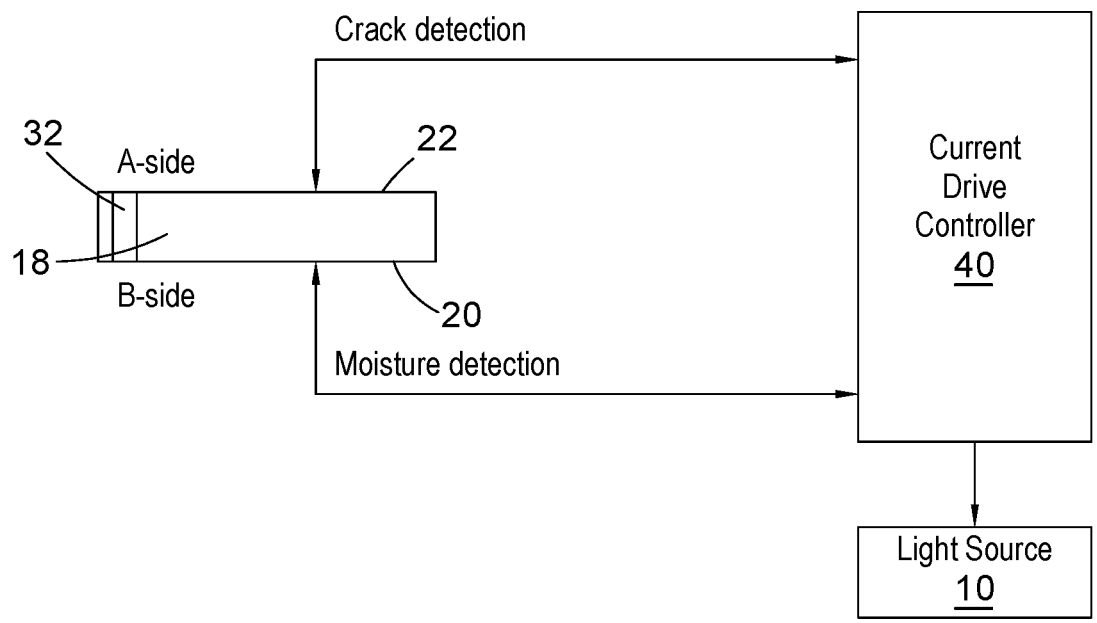
FIG. 3 is a schematic side view of the transmissive cover including traces on its opposing surfaces.

As shown in FIG. 3, each trace 20, 22 can form part of a respective electrical circuit that that is connected, for example, by way of the lead frame 12, to a VCSEL current driver controller 40 or other electronic control unit (ECU). Electrical leads can be provided to connect the traces 20, 22 to the lead frame 12. The controller 40 can reside in the package itself or in a host device (e.g., smartphone) in which the package is integrated. If mechanical damage or moisture is sensed, the controller can facilitate fast switching-off of the emitter power before eye or other damage can occur. If the controller is inside the module, the module can independently and immediately switch off the emitter power and need not rely on the phone manufacturer processing circuitry.

The controller 40 is operable to monitor a respective electrical characteristic of each trace 20, 22 (e.g., resistance or capacitance). If the measured characteristic for a particular one of the traces 20, 22 changes by more than a specified amount (e.g., by more than a specified threshold or is outside a specified range), then the controller 40 turns off or otherwise regulates (e.g., reduces) the optical output produced by the light source 10. For example, in some instances, the controller 40 monitors changes in the resistance of the trace 22 on the outward facing side (i.e., A-side) of the cover 18. If mechanical or other damage occurs to the cover glass 18 such that one or more cracks or other breaks appear in the trace 22, the break(s) would cause a change in the resistance or conductivity, which can be detected by the controller 40. In some implementations, the trace 22 is configured to detect cracks having a width of about 80 µm or more. Likewise, the controller 40 can monitor changes in the capacitance of the trace 20 on the inward facing side (i.e., B-side) of the cover 18. if water or other moisture is present on the inward facing side (i.e., B-side) of the cover, the capacitance of the trace 20 will change and can be detected by the controller 40.

Figure 4:
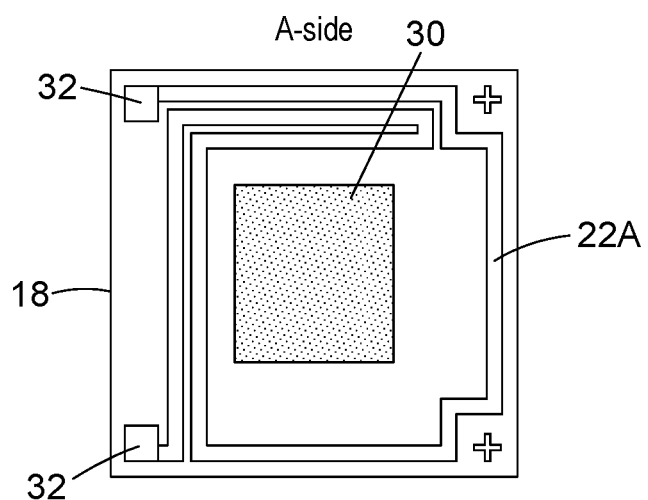
FIG. 4 shows another example of an electrically conductive trace for sensing a crack.

Although forming the trace(s) 20, 22 of a material that is transparent, or at least substantially transparent, to the wavelength(s) of light produced by the light source 10 can be advantageous in some applications, in other implementations, at least one of the trace(s) may be substantially opaque to the wavelength(s) of light produced by the light source 10. FIG. 4 illustrates an example, which includes an electrically conductive structure composed of a chrome trace 22A on one side (e.g., the A-side) of the cover glass 18. Assuming the light source 10 is operable to emit light in the infra-red range of the spectrum, the trace 22A should be disposed on the surface of the cover glass 18 such that it does not overlap with the footprint 30 of the optical beam emitted by the light source, because the chrome is not generally transparent to infra-red radiation. Thus, the trace 22A should be disposed outside the optical path of the beam(s) emitted by the light source 10. By monitoring changes in the resistance of the trace 22A, cracks that begin to propagate from a side edge of the cover glass 18 can be detected before they reach the optically sensitive area 30 of the optical assembly.

Figure 5:
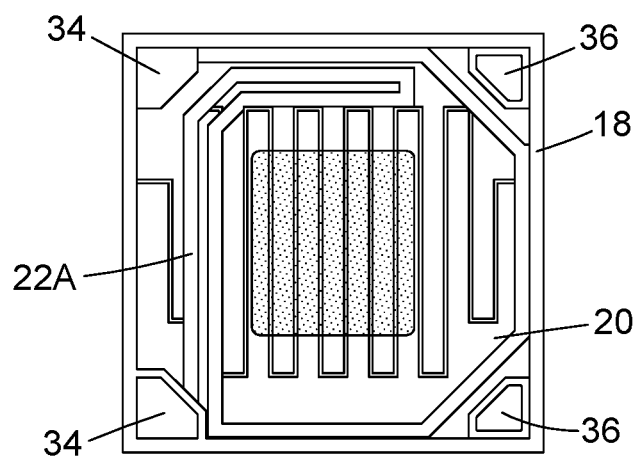
FIG. 5 shows an example of electrically conductive traces on the same side of a transmissive cover for sensing moisture and for sensing a crack.

Although in some implementations it will be desirable to provide the respective traces 20, 22 (or 22A) on different sides of the transmissive cover 18, as described above, in some cases it is possible to provide both traces on the same side of the cover 18. An example, is illustrated in FIG. 5, which shows a first electrically conductive trace 20 optimized for moisture detection, and a second electrically conductive trace 22A is optimized for the detection of defects such as a crack in the cover 18. The traces 20, 22A can be separated from one another, for example, by an insulating layer such as $SiO_2$. Although both traces 20, 22A are on the transmissive cover 18 one of the traces can be disposed in direct contact with the cover, whereas the second trace is in indirect contact with the cover. In the illustrated example, the trace 22A for detecting cracks is slightly closer to the surface of the transmissive cover 18 than is the trace 20 for detecting moisture.

Further, the conductive traces need not necessarily be composed of the same material. Thus, in the illustrated example of FIG. 5, the trace 20 for moisture detection may be composed of ITO or another material that is substantially transparent to infra-red light, whereas the trace 22A for the detection of mechanical defects (e.g., cracks) in the cover 18 may be composed of chrome. Here as well, providing different traces 20, 22A allows monitoring and detection of mechanical defects such as cracks to be decoupled from monitoring and detection of problems arising from the presence of moisture. The decoupling allows the respective configuration for each of the traces 20, 22A to be optimized for detection of particular situations (e.g., the presence of cracks in the optical assembly or the presence of moisture in the package). Such decoupling can, in some instances, improve the safety of the package by facilitating the regulation of power provided to the light source 10 when various types of potential hazards are present.

For implementations in which both traces are disposed on the same side of the transmissive cover 18, optimizing the configurations of the traces should account for possible parasitic interactions between the two conductive layers of the traces.

Various aspects of the subject matter and the functional operations described in this disclosure (e.g., the controller 40) can be implemented in digital electronic circuitry, or in computer software, firmware, or hardware. Thus, aspects of the subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The apparatus can include, in addition to hardware, code that creates an execution environment for the computer program in question, e.g., code that constitutes processor firmware.

The processes and logic flows described in this specification (e.g., monitoring by the controller 40) can be performed, for example, by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The packaged light emitter modules described in this disclosure can be mounted, for example, on a printed circuit board incorporated in a smart phone, tablet, wearable, PDA, computer laptop, personal computer, or other portable computing host device. Electrical connections provide both activation/deactivation) signals for the light source 10, and the safety signals from the conductive trace 20, 22 (or 22A). In general, the foregoing modules can be used in a wide range of applications such as LIDAR, flood illuminators, dot projectors, proximity sensors, 3D sensors and cameras, automotive sensors, and others.

Various modifications will be readily apparent and can be made to the foregoing examples. Features described in connection with different embodiments may be incorporated into the same implementation in some cases, and various features described in connection with the foregoing examples may be omitted from some implementations. Thus, other implementations are within the scope of the claims.

The invention claimed is:

1. An apparatus comprising:
    a light emitter operable to produce light having a particular wavelength;
    a transmissive cover disposed so as to intersect a path of light emitted by the light emitter, wherein the transmissive cover is substantially transparent to the wavelength of light produced by the light emitter;
    a first electrically conductive structure disposed on a first surface of the transmissive cover;
    a second electrically conductive structure disposed on a second surface of the transmissive cover, the second surface being different from the first surface, and each of the first and second surfaces intersecting a path of the light produced by the light emitter; and
    a controller;
    wherein:
        each of the first and second electrically conductive structures is coupled electrically to the controller, and
        the controller is operable to monitor a respective electrical characteristic of each of the first and second electrically conductive structures such that if the monitored characteristic for a particular one of the first or second electrically conductive structures changes by more than a respective predetermined amount, the controller regulates an optical output produced by the light source;
    wherein the controller is operable to monitor signals from the first electrically conductive structure for a change in resistance, and wherein the controller is operable to monitor signals from the second electrically conductive structure for a change in capacitance.

2. The apparatus of claim 1 wherein each of the first and second electrically conductive structures is an electrically conductive trace.

3. The apparatus of claim 1, wherein the first electrically conductive structure is arranged for detecting a mechanical defect in the transmissive cover, and wherein the second electrically conductive structure is arranged for detecting presence of water droplets or condensation.

4. The apparatus of claim 1 wherein the controller is operable to monitor the respective electrical characteristic of each of the first and second electrically conductive structures such that if the monitored characteristic for a particular one of the first or second electrically conductive structures changes by more than a respective predetermined amount, the controller causes the optical output produced by the light source to be stopped.

5. The apparatus of claim 1 wherein at least one of the first or second electrically conductive structures is composed of a material that is substantially transparent to the wavelength of light produced by the light emitter.

6. The apparatus of claim 5 wherein said at least one of the first or second electrically conductive structures at least partially overlaps a footprint of an optical beam emitted by the light source.

7. The apparatus of claim 1 wherein at least one of the first or second electrically conductive structures is composed of ITO.

8. The apparatus of claim 1 wherein at least one of the first or second electrically conductive structures is composed of a material that is substantially opaque to the wavelength of light produced by the light emitter.

9. The apparatus of claim 8 wherein said at least one of the first or second electrically conductive structures does not overlap a footprint of an optical beam emitted by the light source.

10. An apparatus comprising:
    a light emitter operable to produce light having a particular wavelength;
    a transmissive cover disposed so as to intersect a path of light emitted by the light emitter, wherein the transmissive cover is substantially transparent to the wavelength of light produced by the light emitter;
    a first electrically conductive structure disposed on a surface of the transmissive cover, wherein the surface intersects a path of the light produced by the light emitter;
    a second electrically conductive structure disposed on a same side of the transmissive cover as the first electrically conductive structure and separated from the first electrically conductive structure by an insulating layer; and
    a controller;
    wherein:

each of the first and second electrically conductive structures is coupled electrically to the controller, and the controller is operable to monitor a respective electrical characteristic of each of the first and second electrically conductive structures such that if the monitored characteristic for a particular one of the first or second electrically conductive structures changes by more than a respective predetermined amount, the controller regulates an optical output produced by the light source;

wherein the controller is operable to monitor signals from the first electrically conductive structure for a change in resistance, and wherein the controller is operable to monitor signals from the second electrically conductive structure for a change in capacitance.

11. The apparatus of claim 10 wherein each of the first and second electrically conductive structures is an electrically conductive trace.

12. The apparatus of claim 10, wherein the first electrically conductive structure is arranged for detecting a mechanical defect in the transmissive cover, and wherein the second electrically conductive structure is arranged for detecting presence of water droplets or condensation.

13. The apparatus of claim 10 wherein the controller is operable to monitor the respective electrical characteristic of each of the first and second electrically conductive structures such that if the monitored characteristic for a particular one of the first or second electrically conductive structures changes by more than a respective predetermined amount, the controller causes the optical output produced by the light source to be stopped.

14. The apparatus of claim 10 wherein at least one of the first or second electrically conductive structures is composed of a material that is substantially transparent to the wavelength of light produced by the light emitter.

15. The apparatus of claim 14 wherein said at least one of the first or second electrically conductive structures at least partially overlaps a footprint of an optical beam emitted by the light source.

16. The apparatus of claim 10 wherein at least one of the first or second electrically conductive structures is composed of ITO.

17. The apparatus of claim 10 wherein at least one of the first or second electrically conductive structures is composed of a material that is substantially opaque to the wavelength of light produced by the light emitter.

18. The apparatus of claim 17 wherein said at least one of the first or second electrically conductive structures does not overlap a footprint of an optical beam emitted by the light source.

* * * * *